United States Patent
Oh et al.

(10) Patent No.: US 7,667,397 B2
(45) Date of Patent: Feb. 23, 2010

(54) FLAT PANEL DISPLAY DEVICE WITH AT LEAST TWO-LAYER SEALING PASSIVATION LAYER

(75) Inventors: Tae-sik Oh, Suwon-si (KR); Sung-kee Kang, Seongnam-si (KR); Jung-woo Kim, Yongin-si (KR); Ho-nyeon Lee, Seongnam-si (KR); Hong-shik Shim, Seoul (KR); Young-gu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 391 days.

(21) Appl. No.: 11/622,294

(22) Filed: Jan. 11, 2007

(65) Prior Publication Data

US 2007/0159089 A1    Jul. 12, 2007

(30) Foreign Application Priority Data

Jan. 11, 2006    (KR) .................... 10-2006-0003118

(51) Int. Cl.
*H01J 1/62* (2006.01)
*H01J 63/04* (2006.01)

(52) U.S. Cl. .................. 313/512; 313/498; 313/506; 313/292

(58) Field of Classification Search ......... 313/498–512, 313/292, 609
See application file for complete search history.

(56) References Cited

U.S. PATENT DOCUMENTS

| 2004/0124770 | A1* | 7/2004 | Hayashi et al. | ............. 313/506 |
|---|---|---|---|---|
| 2004/0207312 | A1* | 10/2004 | Takashima et al. | .......... 313/503 |
| 2005/0140290 | A1* | 6/2005 | Park et al. | .................... 313/512 |
| 2005/0179377 | A1* | 8/2005 | Shitagami et al. | ........... 313/512 |
| 2005/0189878 | A1* | 9/2005 | Shitagami et al. | ........... 313/512 |
| 2005/0264177 | A1* | 12/2005 | Chung et al. | ................. 313/503 |
| 2006/0055313 | A1* | 3/2006 | Bae et al. | ..................... 313/500 |
| 2006/0061268 | A1* | 3/2006 | Nakanishi | .................... 313/506 |
| 2006/0273717 | A1* | 12/2006 | Wang et al. | .................. 313/512 |
| 2007/0108899 | A1* | 5/2007 | Jung et al. | ................... 313/506 |
| 2007/0159094 | A1* | 7/2007 | Oh et al. | ...................... 313/512 |
| 2007/0159096 | A1* | 7/2007 | Oh et al. | ...................... 313/512 |
| 2007/0182314 | A1* | 8/2007 | Oh et al. | ...................... 313/500 |

FOREIGN PATENT DOCUMENTS

JP    2001-284041    10/2001

* cited by examiner

*Primary Examiner*—Karabi Guharay
*Assistant Examiner*—Kevin Quarterman
(74) *Attorney, Agent, or Firm*—Cantor Colburn, LLP

(57) ABSTRACT

A flat panel display device including a display area in which a desired image is displayed, and a non-display area arranged outside the display area includes bank portions arranged on a substrate in a predetermined pattern in the display area and partitioning a plurality of first openings, an emission element arranged at each first opening, dummy bank portions formed in the non-display area together with the bank portions and a sealing passivation layer covering the emission element, the sealing passivation layer includes at least a two-layer structure including an organic film and an inorganic film alternately deposited, arranged along a surface defining the dummy bank portions on the upper surface of the emission element, and having a sectional portion directed to and contacting the substrate or a film on the substrate.

12 Claims, 7 Drawing Sheets

FIG. 2B
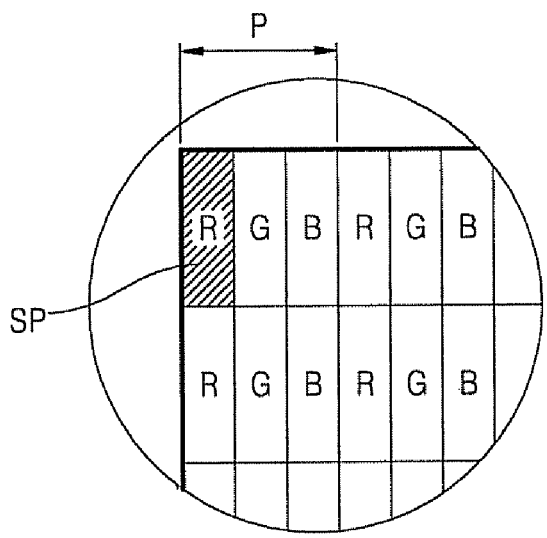
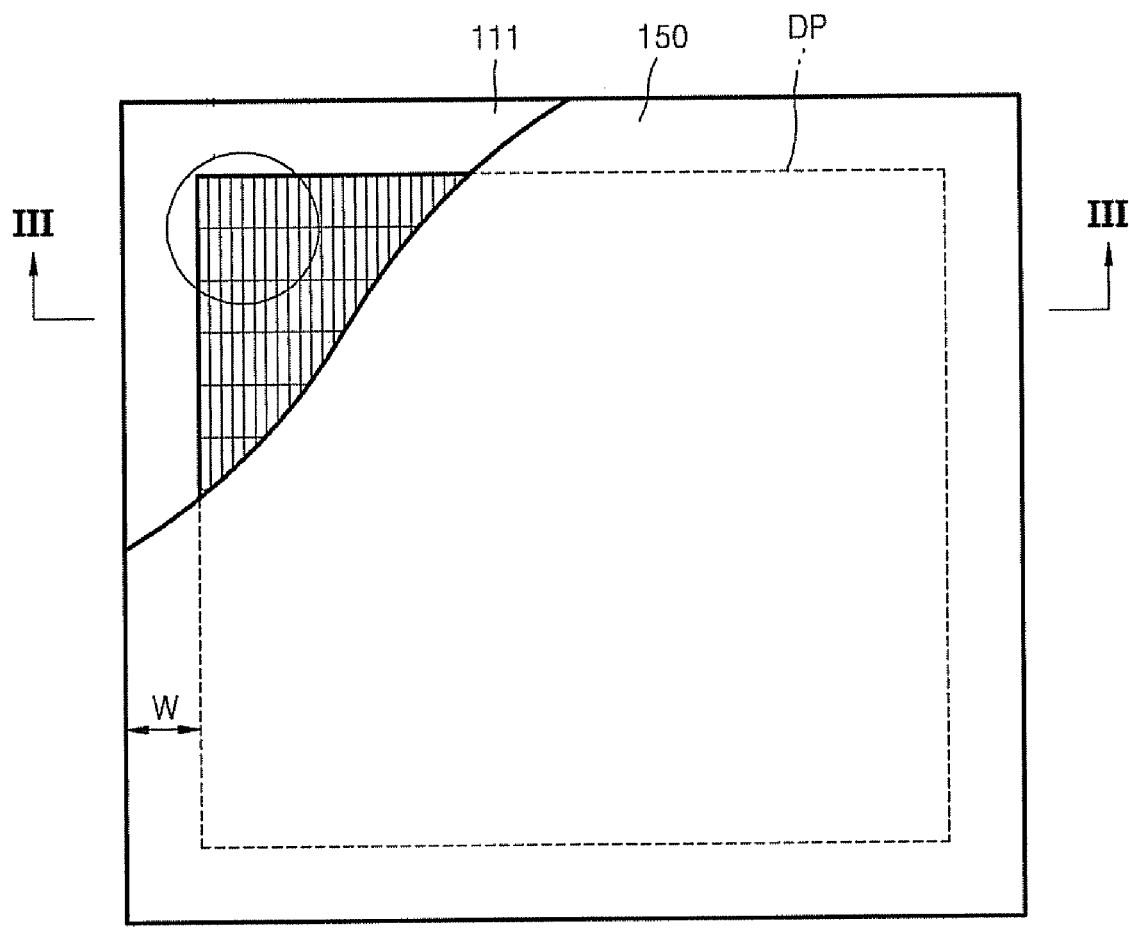
FIG. 2A

FLAT PANEL DISPLAY DEVICE WITH AT LEAST TWO-LAYER SEALING PASSIVATION LAYER

This application claims priority to Korean Patent Application No. 10-2006-0003118, filed on Jan. 11, 2006, and all the benefits accruing therefrom under 35 U.S.C. §119, the contents of which in its entirety are herein incorporated by reference.

BACKGROUND OF THE INVENTION

1. Field of the Invention

The present invention relates to a flat panel display device, and in particular, to a flat panel display device with an improved structure which prevents permeation of harmful material such as moisture or oxygen and degradation of performance of the flat panel display device.

2. Description of the Related Art

FIG. 1 is a cross-sectional view of a conventional flat panel display device, for example, an organic electro-luminescence display panel disclosed in Japanese Patent Publication No. 2001-284041. Referring to FIG. 1, an emission element 20 is formed between partition walls 31 which are extruded on a substrate 11. The emission element 20 includes a first electrode layer 21 as anode injecting holes, an organic film 23 in which light is emitted by the recombination of holes and electrons, and a second electrode layer 27 as cathode injecting electrons. In the organic film 23, light is emitted by the recombination of holes injected from the first electrode layer 21 and electrons injected from the second electrode layer 27, respectively. To this end, it is preferable that the first electrode layer 21 be formed of a material having a high work function and the second electrode layer 27 be formed of material having a low work function. The second electrode layer 27 is highly active and has instable chemical characteristics, and therefore can be easily oxidized or corroded if exposed to outside moisture or oxygen. The organic film 23 having an emission layer also has a degradation of emission due to a change of crystalline structure when moisture or oxygen permeates. In an extreme case, dark spots are formed thereby losing a display function. Therefore, in the conventional art, in order to isolate the organic film 23 and the second electrode layer 27 from the outside, first and second inorganic passivation layers 41 formed of an inorganic compound and a resin capsulation layer 45 therebetween are formed. Since the first and second inorganic passivation layers 41 are stacked over the emission element 20, the permeation of oxygen/moisture through a main face of the first and second passivation layers 41, e.g., the permeation of harmful material via a path R1 is effectively prevented. However, the penetration of harmful material through the side of the exposed first and second passivation layers 41, e.g., the permeation via a path R2 is not effectively prevented.

BRIEF SUMMARY OF THE INVENTION

The present invention provides a flat panel display device blocking permeation of harmful material such as moisture or oxygen, thereby preventing degradation of performance of the flat panel display device over a period of time.

The present invention also provides a flat panel display device having an improved structure requiring minimal additional processing or additional manufacturing cost.

According to an exemplary embodiment of the present invention, there is provided a flat panel display device having a display area in which a desired image is displayed, and a non-display area arranged outside the display area, the display device includes: bank portions arranged on a first substrate in a predetermined pattern in the display area and partitioning a plurality of first openings; an emission element arranged at each first opening; dummy bank portions formed in the non-display area together with the bank portions; and a sealing passivation layer covering the emission element, consisting of at least a two-layer structure including an organic film and an inorganic film alternately deposited, arranged along a surface defining the dummy bank portions, and having a sectional portion contacting a main surface of the first substrate or a film on the first substrate. The sectional portion of the sealing passivation layer is a terminal end thereof.

According to another exemplary embodiment of the present invention, there is provided a flat panel display device having a display area in which a desired image is displayed, and a non-display area arranged outside the display area, the display device includes: bank portions arranged on a substrate in a predetermined pattern in the display area and partitioning a plurality of first openings; an emission element arranged at each first opening; dummy bank portions formed in the non-display area together with the bank portions; and a sealing passivation layer covering the emission element, consisting of at least a two-layer structure comprising an organic film and an inorganic film alternately deposited, arranged along a surface defining the dummy bank portions, and having a sectional portion contacting a side surface of the dummy bank portion. The sectional portion of the sealing passivation layer is a terminal end thereof.

BRIEF DESCRIPTION OF THE DRAWINGS

The above and other aspects, features and advantages of the present invention will become more apparent by describing in more detail exemplary embodiments thereof with reference to the attached drawings in which:

FIG. 2A is a plan view illustrating a structure of an exemplary embodiment of a flat panel display device according to the present invention;

FIG. 2B is an enlarged circled portion of FIG. 2A illustrating a plurality of subpixels of each unit pixel arranged in an array;

DETAILED DESCRIPTION OF THE INVENTION

Figure 1:
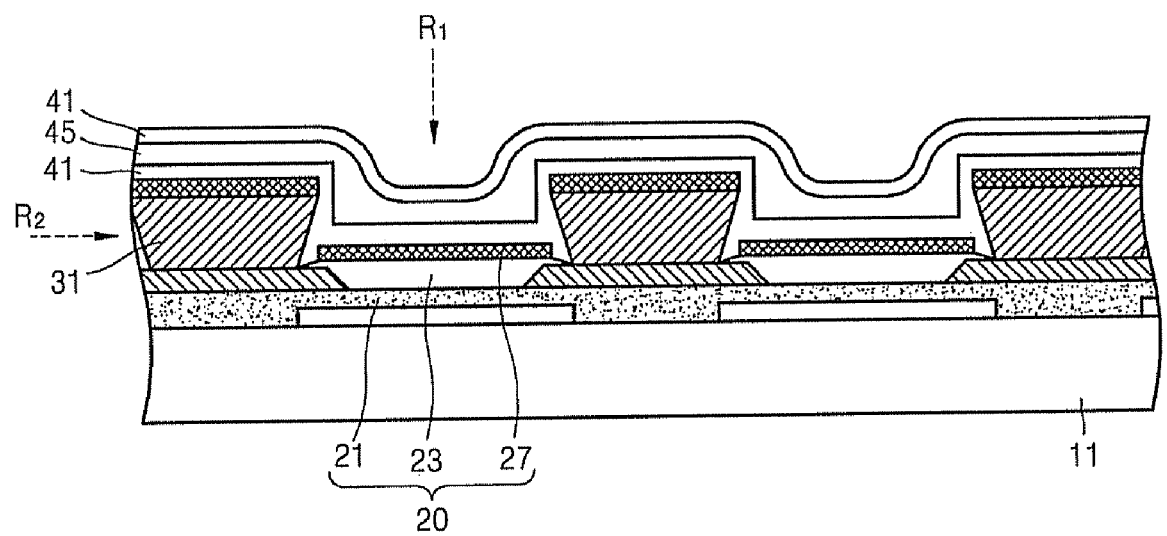
FIG. 1 is a cross-sectional view of a conventional flat panel display device.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in more detail by explaining exemplary embodiments of the present invention with reference to the attached drawings.

FIG. 2A is a plan view of a structure of a flat panel display device according to an embodiment of the present invention. FIG. 2B is an enlarged circled portion of FIG. 2A illustrating a plurality of subpixels of each unit pixel arranged in an array.

Referring to FIGS. 2A and 2B, the flat panel display device includes a display area (DP), which is where a desired image is displayed, and a non-display area outside the display area DP having a desired width W along the border of the display area DP. In the display area DP, a plurality of subpixels SP are arranged in an array. Each subpixel SP is classified as either a red subpixel (R), a green subpixel (G) or a blue subpixel (B) according to an emission color of the subpixel SP. A unit pixel consists of a red subpixel R, a green subpixel G and a blue subpixel B and each subpixel SP includes an emission element (referred to as an "organic EL element") having a corresponding emission color, where "EL" stands for electro luminescence. As will be described below, the non-display area is provided along the outer border region of the display area DP to protect the display area DP. The non-display area is also provided with a dummy bank portion preventing permeation of harmful material.

Figure 3:
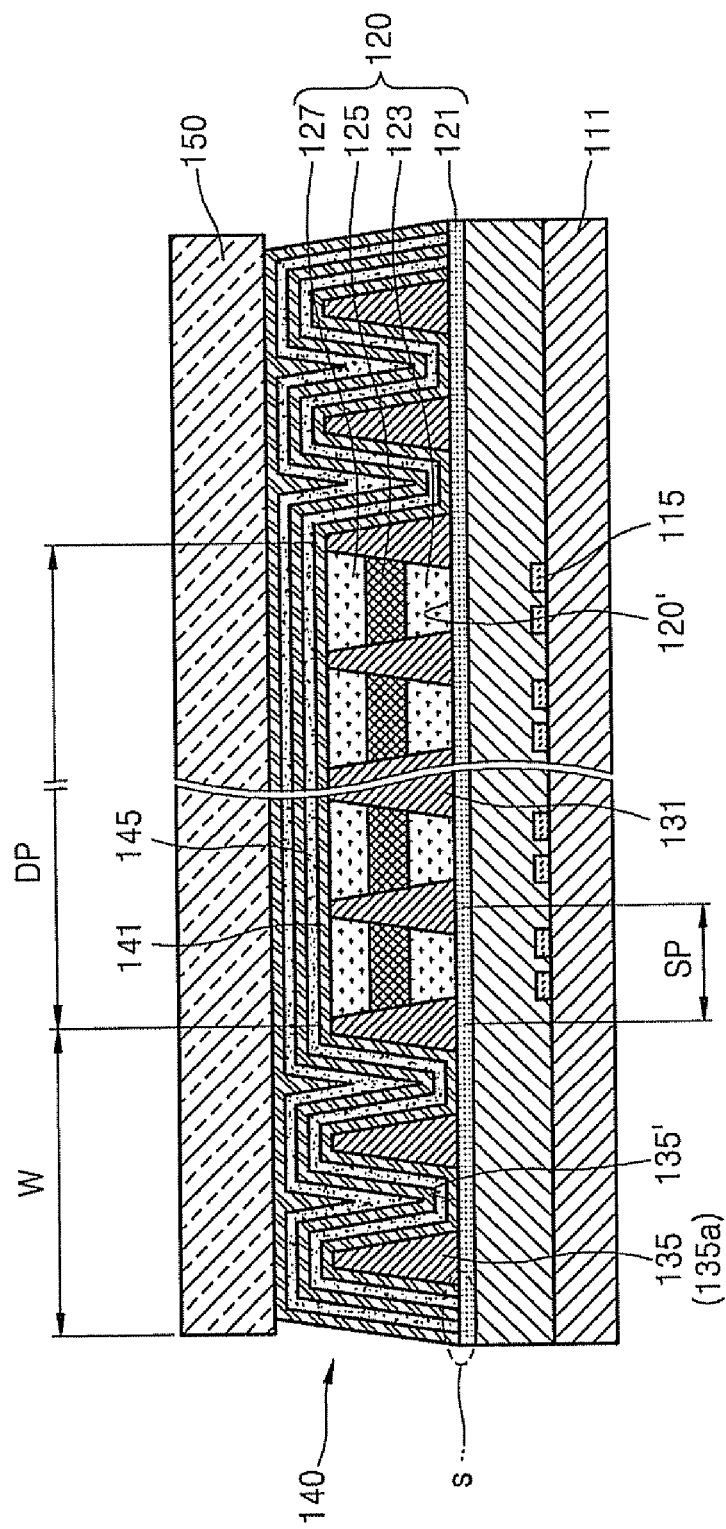
FIG. 3 is a cross-sectional view of the exemplary embodiment of the flat panel display device of FIG. 2 taken along line III-III indicated in FIG. 2, according to the present invention.

FIG. 3 is a cross-sectional view of the exemplary embodiment of the flat panel display device of FIG. 2 taken along line III-III indicated in FIG. 2, according to the present invention. The display area DP is provided with bank portions 131 partitioning a plurality of organic EL elements 120. Each organic EL element 120 forms a light-emitting area which acts independently in electric and optical operation as separated from each other by the bank portions 131. Each organic EL element 120 includes a first electrode 121 and a second electrode 127, and an organic film inserted between the first and second electrodes 121 and 127. Referring to FIG. 3, the organic film includes an emission layer 123 and a hole injecting layer 125. The organic film may have a stacked structure of a hole injection layer ("HIL"), a hole transport layer ("HTL"), an emission layer ("EML"), an electron injection layer ("EIL") and an electron transport layer ("ETL") or a combination thereof. Also, the organic film may have a stacked structure of a hole transport layer ("HTL") and an emission layer ("EML"). The structure of the organic film is not limited to the structures described above, and may be formed of a single emission layer or two layers comprising a hole transport layer and the emission layer or two layers comprising the emission layer and the electron transport layer, for example.

The emission layer 123 is classified as either a red emission layer, a green emission layer or a blue emission layer according to emission color.

The first electrode 121 and the second electrode 127 function as a cathode and an anode, respectively. The first electrode 121 may be formed commonly to the organic EL elements 120 and the second electrode 127 may be formed independently of each organic EL element 120. The flat panel display device according to the current exemplary embodiment of the present invention is a top emission type and it is desirable for effective light extraction therefrom to make the second electrode 127 formed of a transparent electrode material. The transparent electrode material used to form the second electrode 127 includes, for example, indium tin oxide ("ITO"), indium zinc oxide ("IZO"), and other similar transparent electrode materials. It is desirable that the first electrode 121 is formed of a metal film having good light reflective properties, such as Al or Ag, to reflect a downward injecting display light from the emission layer 123 upwards.

The flat panel display device according to the current exemplary embodiment is an active matrix display device containing thin film transistors ("TFTs") such as switching TFTs, driving TFTs, etc. and capacitors may be included in a TFT layer 115 deposited under the organic EL element 120. The number or the type of the TFTs is not limited to the above described examples. For example, a switching TFT detects an on/off condition of the corresponding organic EL element 120 and a driving TFT controls the current applied to the organic EL element 120 according to a signal from the switching TFT. The second electrode 127 is electrically connected to the drain electrode of the driving TFT and a driving current is applied to a corresponding organic EL element 120 through the second electrode 127.

Figure 4:
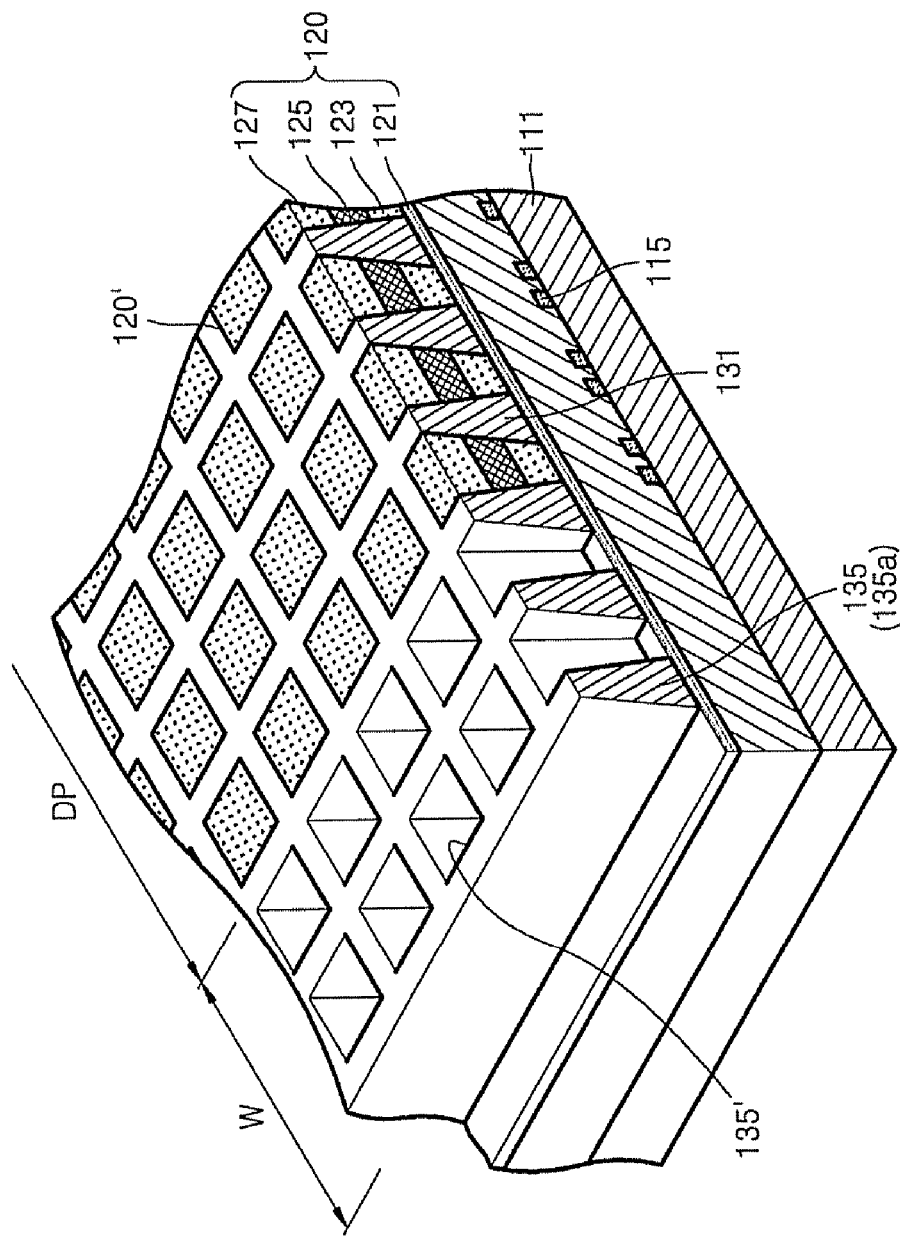
FIG. 4 is an enlarged partial perspective view of the exemplary embodiment of the flat panel display device of FIG. 2 showing bank portions and dummy bank portions illustrated in FIG. 3, according to the present invention.

FIG. 4 is an enlarged partial perspective view of the exemplary embodiment of the flat panel display device of FIG. 2 showing bank portions 131 and dummy bank portions 135 illustrated in FIG. 3, according to the present invention. In the display area DP, the bank portions 131 partitioning a plurality of first openings 120' are formed in a predetermined matrix formation and the emission layer 123, the hole injection layer 125 and the second electrode 127 are laminated successively in the first openings 120'. In particular, the emission layer 123, the hole injection layer 125 and the second electrode 127 are laminated successively on the first electrode 121 exposed through the first opening 120'.

In the non-display area, the dummy bank portions 135 are provided. The same pattern as that of the bank portions 131 in the display area DP, e.g., the matrix pattern, extends to the outside of the display area DP and a plurality of second openings 135' are segmented by the dummy bank portions 135. A sealing passivation layer as will be described below fills the second openings 135'. The bank portions 131 and the dummy bank portions 135 integrated thereto are formed according to the following process. That is, after coating a raw material paste of the bank portions 131 on a first substrate 111 in which a TFT layer 115 and the first electrode 121 are formed, e.g., coating polymer resin material such as polyvinyl acetate ("PVA") over the whole surface of the first substrate 111 including the display area DP and the non-display area, by forming the predetermined matrix pattern in both the display area and the non-display area, the bank portions 131 and the dummy bank portions 135 integrated thereto are obtained simultaneously.

The dummy bank portions 135 perform a shielding function preventing permeation of harmful material such as oxygen and moisture which oxidize and corrode the emission layer 123 or the first and second electrodes 121 and 127 of the organic EL element 120. Compared with conventional techniques requiring an additional process and cost for manufacturing, a partitioning wall to prevent the permeation of harmful material, the present invention uses a conventional process for forming the bank portions 131 in the display area DP for forming the display bank portions 135 functioning as a shield barrier so that additional processes are not necessary and costs are minimized. The dummy bank portions 135 include dummy banks 135a arranged with the second openings 135' defined between adjacent dummy banks 135a. It may be effective to locate at least two dummy banks 135a in series for preventing permeation of harmful elements.

Referring to FIG. 3, on the upper surface of the organic EL element 120, a sealing passivation layer 140 is provided to prevent permeation of moisture and oxygen into the organic EL element 120. The sealing passivation layer 140 may have at least two films having a blocking ability to prevent harmful material from permeating to the organic EL element 120. In this case, the sealing passivation layer 140 has at least one organic film 141 and one inorganic film 145.

With exposure to outside oxygen or moisture (as the harmful material), the sealing passivation layer 140 has a function of preventing the inner films from being oxidized and corroded with the harmful material. That is, the sealing passivation layer 140 isolates the first and second electrodes 121 and 127, as well as isolating the emission layer 123 of the organic EL element 120 from the harmful material. The sealing passivation layer 140 is formed not only in the display area DP in which the organic EL element 120 is located, but also in the non-display area. The sealing passivation layer 140 in the non-display area is formed in a corrugated shape along the dummy bank portions 135, as illustrated in FIG. 3. The corrugated shape results from the sealing passivation layer 140 filling the second openings 135' defined between adjacent dummy banks 135a.

The sealing passivation layer 140 is constructed in a laminated structure of the organic film 141/inorganic film 145 having different material characteristics so that the resistance to permeation of moisture or oxygen is increased and at least, the permeation rate is quite retarded near the interface of the organic film 141/inorganic film 145. The organic film 141 may be formed of a high molecular organic film, for example, polyacrylate, polyurea, polyester, polyethylene, polypropylene, methacrylic, acrylic, and derivatives thereof or a small molecular weight organic film, for example, but is not limited thereto. Also, the inorganic film 145 deposited on the organic film 141 may be formed of oxide, carbide and nitride of silicon, for example $SiO_2$, SiC, SiN, SiON or $In_2O_3$, $TiO_2$, $Al_2O_3$.

Due to the multi-layered sealing passivation layer 140, permeation of harmful material through a main surface, e.g., the upright permeation of the sealing passivation layer 140 is substantially prevented. However, in spite of the multi-layered structure, harmful material may still permeate along the organic film 141 or the inorganic film 145 after entering through a sectional portion S of the sealing passivation layer 140. In the present invention, permeation of harmful material through the sectional portion S may be prevented by not exposing the cross section of the sealing passivation layer 140 to the outside. In an exemplary embodiment of the present invention, the sectional portion S of the sealing passivation layer 140 contacts the first electrode 121 structurally preventing contact between the sectional portions S of the sealing passivation layer 140 and the harmful material, such as oxygen and/or moisture. The sectional portion S of the sealing passivation layer is a terminal end thereof.

The sealing passivation layer 140 formed at the non-display area is coated on the dummy bank portions 135 and has a corrugated shape. The filling member coated on the sealing passivation layer 140 is filled on the concave portion of the corrugated shape and functions as a planarization layer to make a planar surface. Thus, a second substrate 150 arranged on the sealing passivation layer 140 may be tightly attached to the planar surface of the sealing passivation layer 140 without having a gap therebetween.

In the sealing passivation layer 140, an interfacing film directly contacting the organic EL element 120 may consist of the organic film 141 or the inorganic film 145 according to a depositing order. However, it is preferable that the interfacing film is the organic film 141 directly contacting the organic EL element 120 due to its planarization effect.

Figure 5:
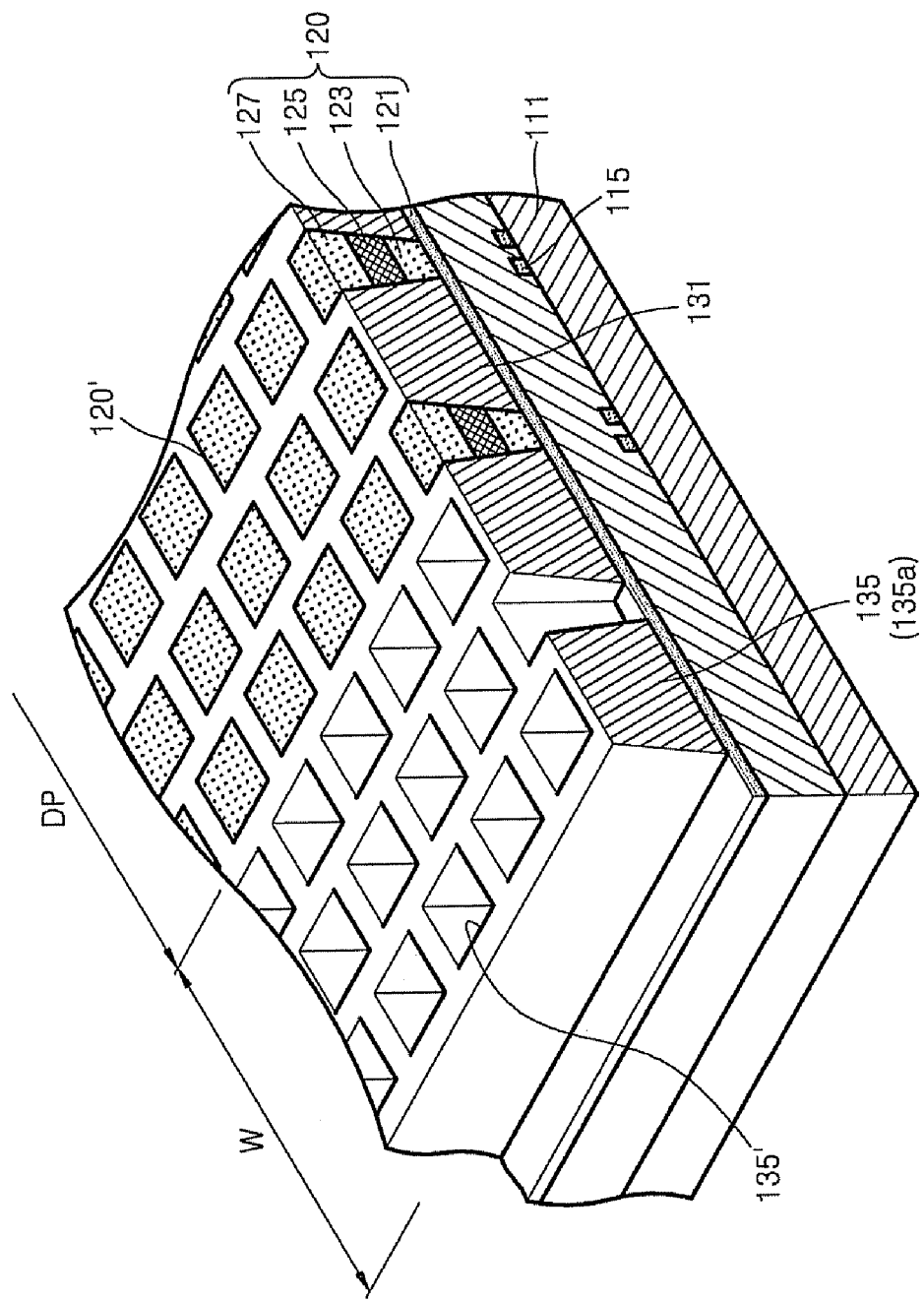
FIGS. 5 and 6 are enlarged partial perspective views of the flat panel display device of FIG. 2 showing modified bank portions and dummy banks portion according to exemplary embodiments of the present invention.
Figure 6:
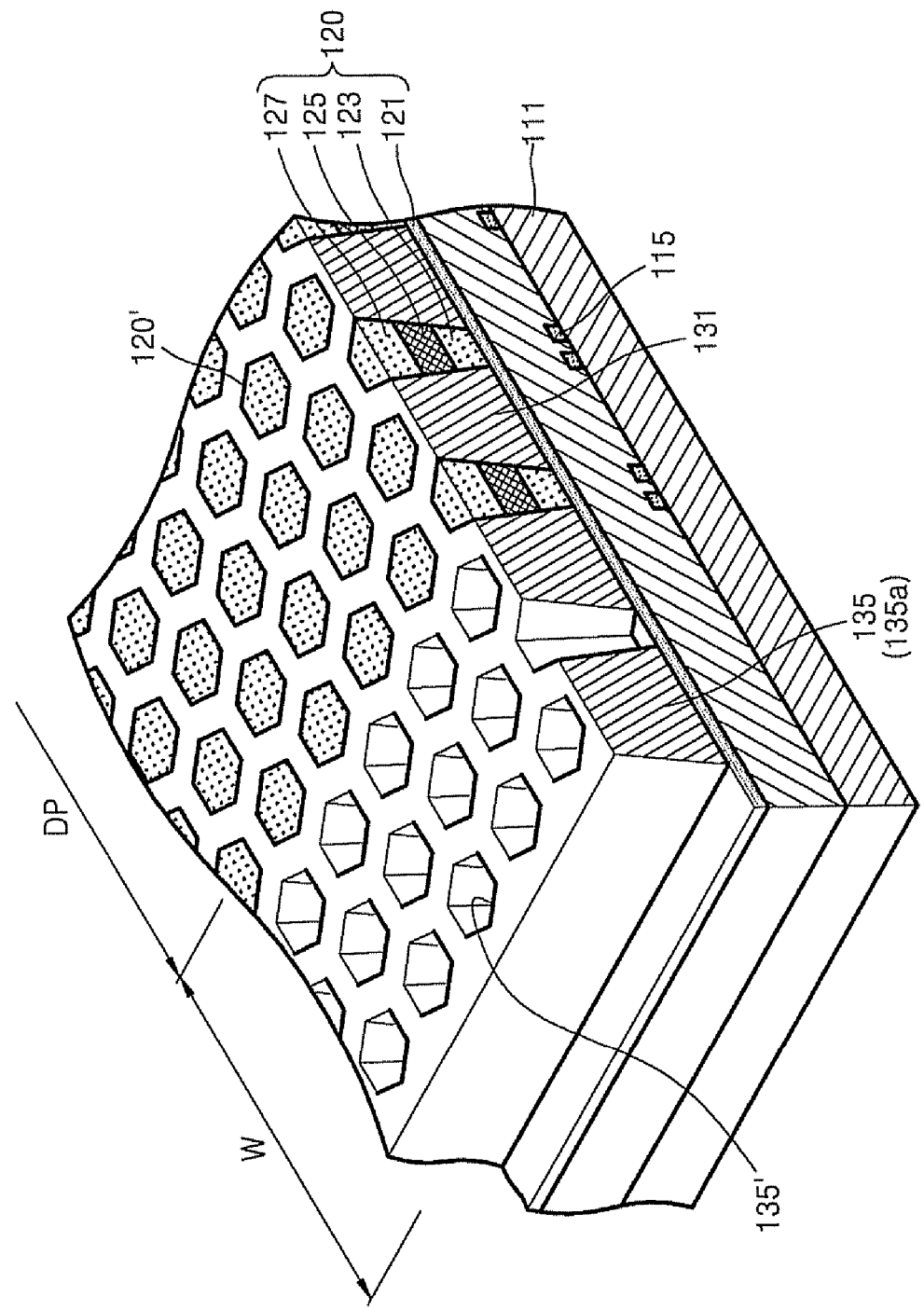

Referring to FIG. 4, the bank portions 131 and the dummy bank portions 135 are formed in a matrix pattern and the openings 120' and 135', respectively, partitioned by them are arranged in parallel along one direction and are arranged perpendicular to the one direction. The scope of the present invention is not limited to the pattern of the bank portions 131 and the dummy bank portions 135, and for example, the openings 120' and 135' partitioned by the bank portions 131 and the dummy bank portions 135 shown in FIG. 5 are arranged in parallel along one direction but they are arranged in a zigzag formation along a perpendicular direction to the one direction. The openings 120' and 135' partitioned by the bank portions 131 and the dummy bank portion 135 shown in FIG. 6 have a hexagonal honey comb structure and various other polygonal shapes of the bank portions 131 and the dummy bank portions 135 may be provided in alternative exemplary embodiments of the present invention. In the modified exemplary embodiments shown in FIGS. 5 and 6, like reference numerals in the drawings denote like elements as previously described.

Figure 7:
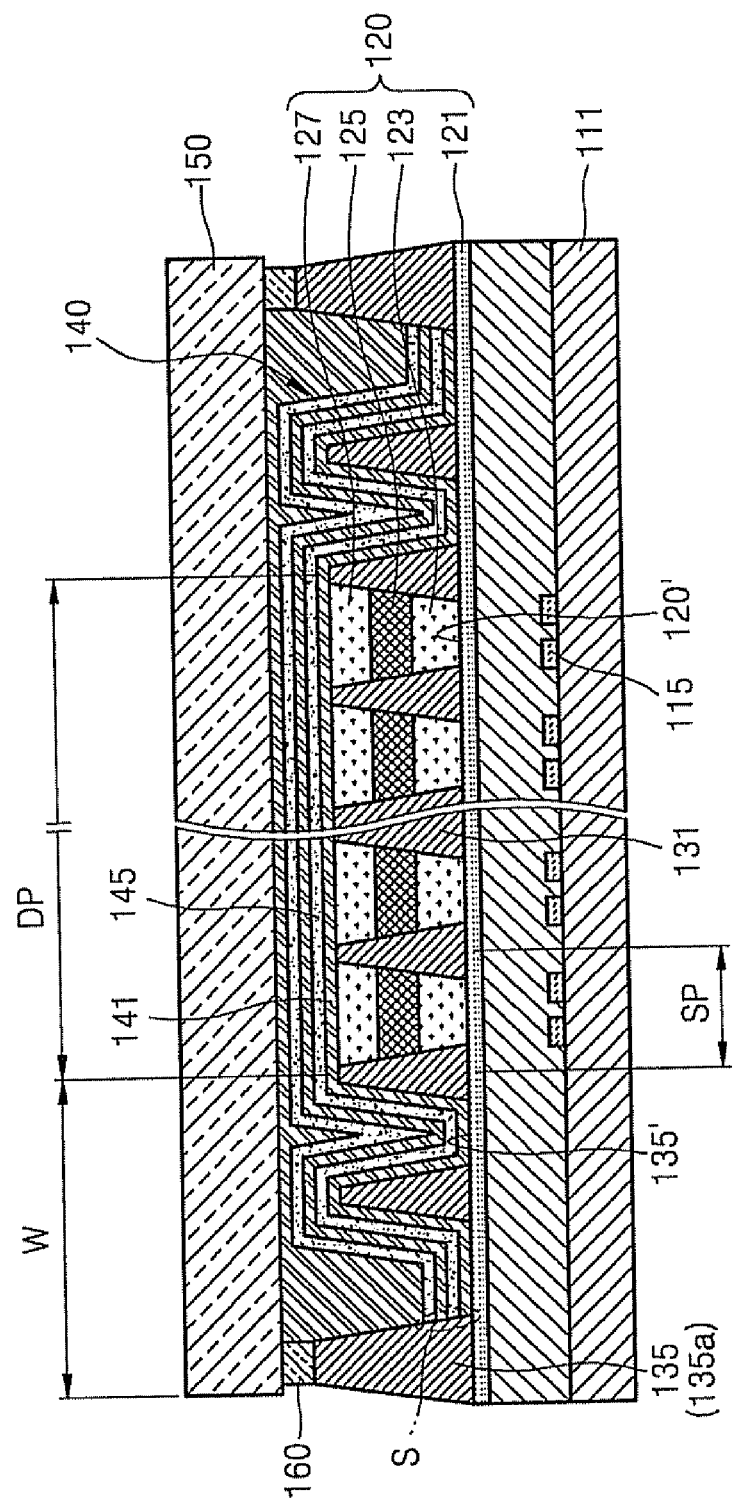
FIG. 7 is a cross-sectional view of another exemplary embodiment of a flat panel display device according to the present invention.

FIG. 7 is a cross-sectional view of another exemplary embodiment of a flat panel display device according to the present invention. Like reference numerals in the drawings denote like elements as previously described. Referring to FIG. 7, a light-emitting element 120 is arranged in the display area DP and the organic EL element 120 includes films 123, 125 and 127 sequentially deposited in a first opening 120' partitioned by bank portions 131. Since the organic light-emitting element 120 is sealed from the outside by a sealing passivation layer 140, the inner film of the organic EL element 120 is prevented from being oxidized and corroded. The sealing passivation layer 140 is formed in a corrugated shape over the non-display area along dummy bank portions 135 filling second openings 135'. A sectional portion S of the sealing passivation layer 140 contacts slanted surfaces defining the dummy bank portions 135. In particular, the dummy bank portions 135 include dummy banks 135a arranged with the second openings 135'. The sectional portion S of the sealing passivation layer 140 contacts the slanted surfaces defining the dummy banks 135a arranged at the outermost location. Thus, permeation of harmful material through the sectional portion S is prevented.

The sealing passivation layer 140 is formed by sequentially depositing raw material paste of the organic film 141 and the inorganic film 145. It is difficult to precisely control the end points of the organic film 141 and the inorganic film 145 according to processing characteristics. That is, it is desirable that the location of forming the sectional portion S is controlled so as to not expose the sectional portion S of the sealing passivation layer 140, and thus, controlling of the end point of the films 141 and 145 is required. In order to stop a nozzle which is continuously ejecting the raw material paste and moving in one direction at a precise location, a stopping location of the nozzle and halting ejection of the raw material needs to be controlled very precisely. To solve this problem, in the current exemplary embodiment of the present invention, the dummy bank portions 135a located at an outside edge function as stoppers to the nozzle. By the dummy bank portions 135a, the flow of the paste ejected from the nozzle can be stopped smoothly and the sectional portion S of the sealing passivation layer 140 is formed by contacting the dummy bank portions 135a. Thus, permeation of harmful material through the sectional portion S may be prevented.

The uppermost surface of the dummy banks 135a located at the outermost position may not be covered by the sealing passivation layer 140 and may be spaced from the second substrate 150 by as much as the thickness of the sealing passivation layer 140. To prevent the permeation of harmful material through this gap, a sealing member 160 may be arranged between the dummy banks 135a located at the outermost position and the second substrate 150. For example, the sealing member 160 may be formed using a hardening process after inserting a liquid sealant between the dummy banks 135a and the second substrate 150. It is desired that at least two dummy banks 135a are located with the second opening 135' therebetween continuously and overlapping each other since the dummy bank portions 135 function as a blocking member to prevent permeation of outside harmful material.

In the meantime, in the specification, for convenience of explanation, the active matrix flat panel display device controlling an input signal per pixel using the thin film transistors ("TFTs") is described as an exemplary embodiment of the present invention, but the present invention is not limited to the driving method. Thus, the present invention may be applied to the passive matrix flat panel display device.

According to the flat panel display device of the present invention, in order to protect the inner emission element of the display device from harmful material such as oxygen and/or moisture, the inner portion of the display device is reliably sealed. Especially, the sectional portion of the sealing member is not exposed to the outside so as to prevent permeation of harmful material. Thus, formation of a dark spot resulting in a loss of its display function and brightness is prevented.

In particular, according to the flat panel display device of the present invention, by using a conventional process to form the bank portions in the display area, the dummy banks are formed together with the bank portions to prevent harmful materials from permeating, and thus additional manufacturing processes or additional manufacturing costs may be minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display device having a display area in which a desired image is displayed, and a non-display area arranged outside the display area, the display device comprising:
  a first substrate;
  bank portions arranged on the first substrate in a predetermined pattern in the display area and partitioning a plurality of first openings;
  an emission element arranged at each first opening;
  dummy bank portions formed on the first substrate in the non-display area together with the bank portions; and
  a sealing passivation layer covering the emission element, consisting of at least a two-layer structure comprising an organic film and an inorganic film alternately deposited, arranged along an uneven surface defined by the dummy bank portions, and having a sectional end portion contacting a main surface of the first substrate or a film on the first substrate.

2. The display device of claim 1, wherein the emission element is an organic EL element comprising, a first electrode, a second electrode and an organic film located between the first and second electrodes.

3. The display device of claim 2, wherein the first substrate and a second substrate disposed facing another with the emission elements therebetween are formed of a glass material or a plastic material.

4. The display device of claim 3, wherein the sectional portion of the sealing passivation layer contacts the first electrode arranged below the dummy bank portions in the non-display area.

5. The display device of claim 4, wherein the dummy bank portions are formed in a same pattern as that of the bank portions in the display area and a plurality of second openings are partitioned by the dummy bank portions.

6. The display device of claim 5, wherein the second openings partitioned by the dummy bank portions are filled with the sealing passivation layer.

7. The display device of claim 5, wherein, the dummy bank portion comprises at least two dummy banks arranged in series with the second openings therebetween.

8. The display device of claim 7, wherein the sectional portion of the sealing passivation layer is a terminal end thereof.

9. A flat panel display device having a display area in which a desired image is displayed, and a non-display area arranged outside the display area, the display device comprising:
- bank portions arranged in a predetermined pattern in the display area and partitioning a plurality of first openings;
- an emission element arranged at each first opening;
- dummy bank portions formed in the non-display area together with the bank portions; and
- sealing passivation layer covering the emission element, consisting of at least a two-layer structure comprising an organic film and an inorganic film alternately deposited, the sealing passivation layer arranged along an uneven surface defined by the dummy bank portions, and having a sectional portion contacting a side surface of the dummy bank portion.

10. The display device of claim 9, wherein the dummy bank portions comprise at least two dummy banks arranged in series with second openings therebetween and the sectional portion of the sealing passivation layer contacts the side surface of the dummy bank arranged at the outermost location.

11. The display device of claim 10, wherein the surfaces of the remaining dummy banks except for the dummy bank located at the outermost position are enclosed with the sealing passivation layer.

12. The display device of claim 9, wherein the sectional portion of the sealing passivation layer is a terminal end thereof.

* * * * *